United States Patent
Koike et al.

[11] Patent Number: 6,031,732
[45] Date of Patent: Feb. 29, 2000

[54] ELECTRONIC APPARATUS WITH A SHIELD STRUCTURE AND A SHIELD CASE USED IN THE SHIELD STRUCTURE AND A MANUFACTURING METHOD OF THE SHIELD CASE

[75] Inventors: Noboru Koike; Yutaka Nakamura, both of Tokyo, Japan

[73] Assignee: Kabushiki Kaisha Toshiba, Kawasaki, Japan

[21] Appl. No.: 08/563,591

[22] Filed: Nov. 28, 1995

[30] Foreign Application Priority Data

Nov. 28, 1994 [JP] Japan .................................. 6-292527
Jul. 25, 1995 [JP] Japan .................................. 7-187600

[51] Int. Cl.$^7$ ...................................................... H05K 9/00
[52] U.S. Cl. ..................... 361/816; 361/752; 361/799; 361/800; 361/814; 361/818; 174/35 R
[58] Field of Search ............................... 455/90, 91, 347, 455/348, 351, 128, 352; 361/752, 798–800, 814, 816, 818, 733, 736; 174/35 R, 35 GC, 35 TS; 206/719

[56] References Cited

U.S. PATENT DOCUMENTS

| | | | |
|---|---|---|---|
| 2,963,577 | 12/1960 | Errichiello et al. | 455/349 |
| 3,332,860 | 7/1967 | Diebold et al. | 427/180 |
| 4,500,595 | 2/1985 | Gerteisen et al. | 428/294 |
| 4,542,076 | 9/1985 | Bednarz et al. | 428/624 |
| 4,663,240 | 5/1987 | Hajdu et al. | 428/545 |
| 5,120,578 | 6/1992 | Chen et al. | 427/304 |
| 5,206,796 | 4/1993 | Thompson et al. | 361/818 |
| 5,438,482 | 8/1995 | Nakamura et al. | 361/816 |
| 5,519,572 | 5/1996 | Luo | 361/685 |
| 5,566,055 | 10/1996 | Salvi, Jr. | 361/816 |
| 5,596,487 | 1/1997 | Castaneda et al. | 361/814 |
| 5,639,990 | 6/1997 | Nishihara et al. | 174/52.2 |

FOREIGN PATENT DOCUMENTS 00413818  6/1992  Germany .

*Primary Examiner*—Leo P. Picard
*Assistant Examiner*—Jayprakash N. Gandhi
*Attorney, Agent, or Firm*—Banner & Witcoff, Ltd.

[57] ABSTRACT

A shield case for use in a electronic apparatus enclosed in a housing, includes a groove mating with a protruding portion of the housing. When the shield case is clamped between a PC board and the housing, the shield case is urged toward the PC board, and thereby contacts a ground pattern of the PC board.

23 Claims, 10 Drawing Sheets

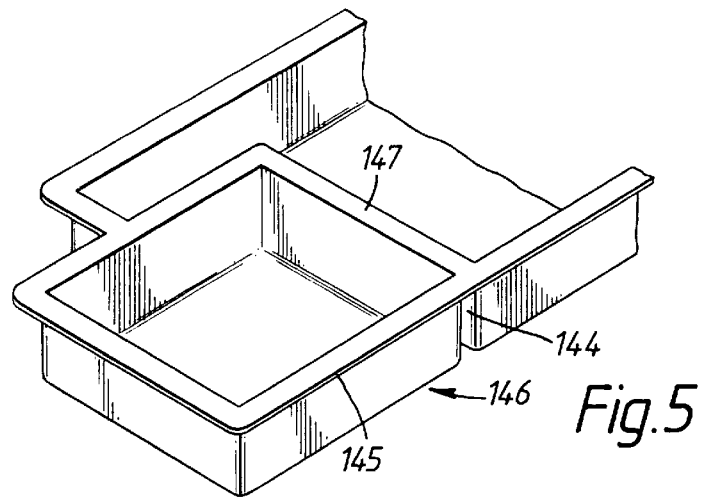
Fig.5
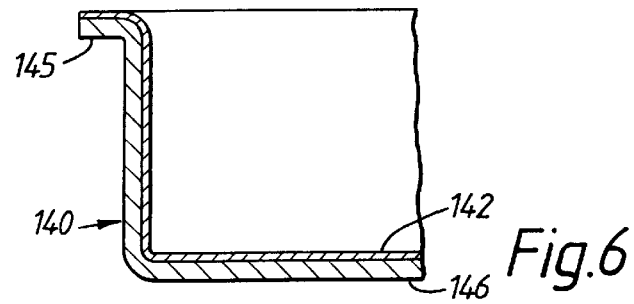
Fig.6
| PROPERTY<br>MATERIAL | HEAT STABILITY | METAL PLATING PROPERTY | AGE SOFTENING PROPERTY |
|---|---|---|---|
| PET | FAIRLY BAD | GOOD | GOOD |
| PC | GOOD | GOOD | GOOD |
| PVC | BAD | GOOD | FAIRLY BAD |
| ABS | FAIR | GOOD | GOOD |
Fig.7

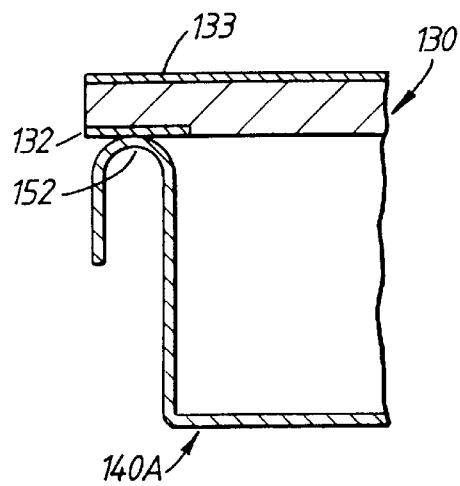
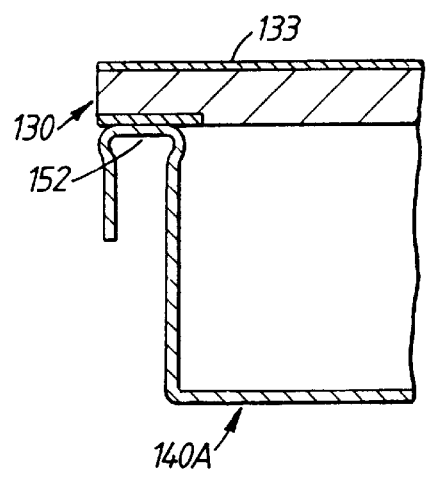
Fig 11(a)　　　　　Fig 11(b)
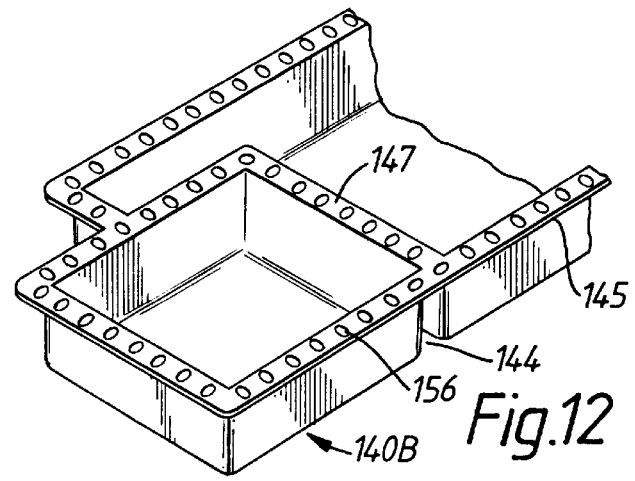
Fig.12
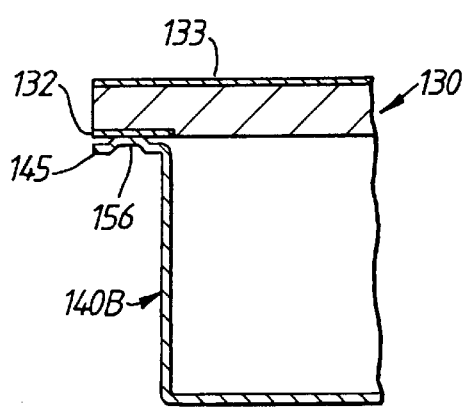
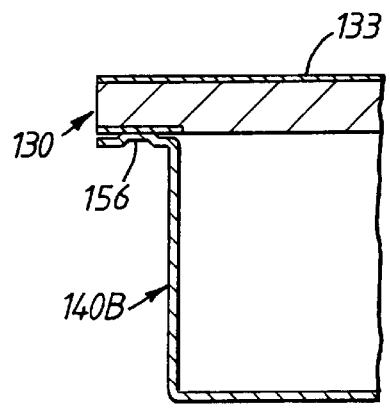
Fig.13(a)　　　　　Fig.13(b)

6,031,732

ELECTRONIC APPARATUS WITH A SHIELD STRUCTURE AND A SHIELD CASE USED IN THE SHIELD STRUCTURE AND A MANUFACTURING METHOD OF THE SHIELD CASE

BACKGROUND OF THE INVENTION

1. Field of the Invention

This invention is generally relates to a shield structure for use in an electronic apparatus, and more particularly to a shield structure of reduced size and which lightens the electronic apparatus.

2. Description of the Related Art

Referring to FIG. 19, a conventional radio communication apparatus includes a first housing 10, a second housing 20, and a printed circuit board 30 (called PC board hereinafter). Many components 31 are mounted on the PC board 30. A male screw 40 is fitted to a female screw 12, thereby the PC board 30 and the first housing are fitted to the second housing 20.

To shield the components 31, some shield structure are used in the conventional apparatus. FIG. 20 shows the conventional apparatus using a conventional shield structure. A partial view illustrated by one dot line A is shown in FIG. 21. A conductive layer 21 is plated on an inner surface of the second housing 20.

A first ground pattern 32 is printed on a surface of the PC board 30, while a second ground pattern 33 is printed on another surface of the PC board 30. The second housing 20 has a protruding portion 22.

When the first housing 10 and the PC board 30 are fitted to the second housing 20, the protruding portion 22 is urged toward the first ground pattern 32 and thereby contacts the first ground pattern 32. This structure enables the components 31 to be shielded by the conductive layer 21, the first ground pattern 32 and the second ground pattern 33.

Further, to enhance the connection between the conducive layer 21 and the first ground pattern 32, the conducive member 23 may be provided between the protruding portion 22 and a first ground pattern 32 as shown in FIG. 22.

In the above two conventional apparatus, the second housing 20 includes a resin member 26 and the conductive layer 21. The resin member 26 is molded by a resin mold injection method. After the resin member 26 is molded, the molded resin member 26 is transported to a conductive layer plating process. While the molded resin member 26 is transported to the conductive layer plating process, it is necessary to transport the molded resin member 26 carefully so that the molded resin member 26 is not injured.

Further, in the plating process, it is necessary to mask a predetermined area of the inner surface of the molded resin member 26 so that the conductive layer 21 is plated to only a portion other than the predetermined area. Therefore, it is troublesome to mask the predetermined area. Accordingly, this troublesome process causes high cost.

Furthermore, when the radio telecommunication apparatus is out of order and is to be disposed, it is not so easy to separate the conductive layer 21 from the molded resin member 26. Therefore, this structure is not suitable for the disposal of the housing 20, that is to say, this structure is not suitable for recycling the housing.

A third conventional structure is shown in FIG. 23. A housing 20A, as shown in FIG. 24, is made of resin material. The components 31 are shielded by each of a plurality of conductive shield cases 34. A partial view illustrated by one dot line B is shown in FIG. 24. Each of the shield cases 34 is attached to the first ground pattern 32 on the PC board 30 by soldering.

In this structure, it is troublesome to solder the shield case 34 to the PC board 30. Further, since the space between the shield case 34 and the housing 20A is needed, the third conventional apparatus becomes large in size and heavy in weight.

SUMMARY OF THE INVENTION

Accordingly, the present invention has been made in view of the above circumstance and has an object to provide an electronic apparatus which eliminates plating process for plating a conductive layer on a surface of a housing of the electronic apparatus.

Another object of the present invention is to provide an electronic apparatus having a housing which is suitable for recycling the housing.

Additional object of the present invention is to provide an electronic apparatus which reduces a dead space between the housing and the shield case, and thereby reduces the size and the weight of the apparatus.

To achieve these objects and other objects and advantages with the purposes of the invention, there is provided:

an electronic apparatus comprising, a circuit board having a ground pattern, components mounted on the circuit board, a housing including a first location determination portion, and a shield case for shielding the components, having a second location determination portion mating with the first location portion and a conductive layer provided on the shield case, wherein the shield case is clamped between the circuit board and the housing, and the conductive layer contacts the ground pattern.

Additional objects and advantages of the invention will be set forth in part in the description which follows and in part will be apparent from the description, may be learned by practice of the invention. The objects and advantages of the invention may be realized and attained by means of the instrumentalities and combinations particularly pointed out of in the written description and claims hereof as well as the appended drawings.

It is understood that both the foregoing general description and the following detailed description are exemplary and explanatory and are intended to provide further explanation relating to the invention as claimed.

BRIEF DESCRIPTION OF THE DRAWINGS

The accompanying drawings, which are incorporated in and constitute a part of this specification, illustrate several embodiments of the invention and, together with the description, serve to explain the objects, advantages, and principles of the invention. In the drawings.

FIG. 5 is a first step of manufacturing process in which a shield case according to the first embodiment is manufactured;

FIG. 6 is a second step of manufacturing process in which the shield case according to the first embodiment is manufactured;

FIG. 7 is a comparison table comparing of properties of materials which are suitable for the shield case according to the first embodiment;

FIGS. 11(a) and 11(b) are partial cross-sectional view illustrating the attachment state of the shield case according to the third embodiment;

FIG. 12 is a perspective view illustrating a shield case according to a fourth embodiment;

FIGS. 13(a) and 13(b) are partial cross-sectional view illustrating the attachment state of the shield case according the fourth embodiment;

DESCRIPTION OF THE PREFERRED EMBODIMENTS

Reference will now be made in detail to present preferred embodiments of the invention, example of which are illustrated in the accompanying drawings.

Figure 1:
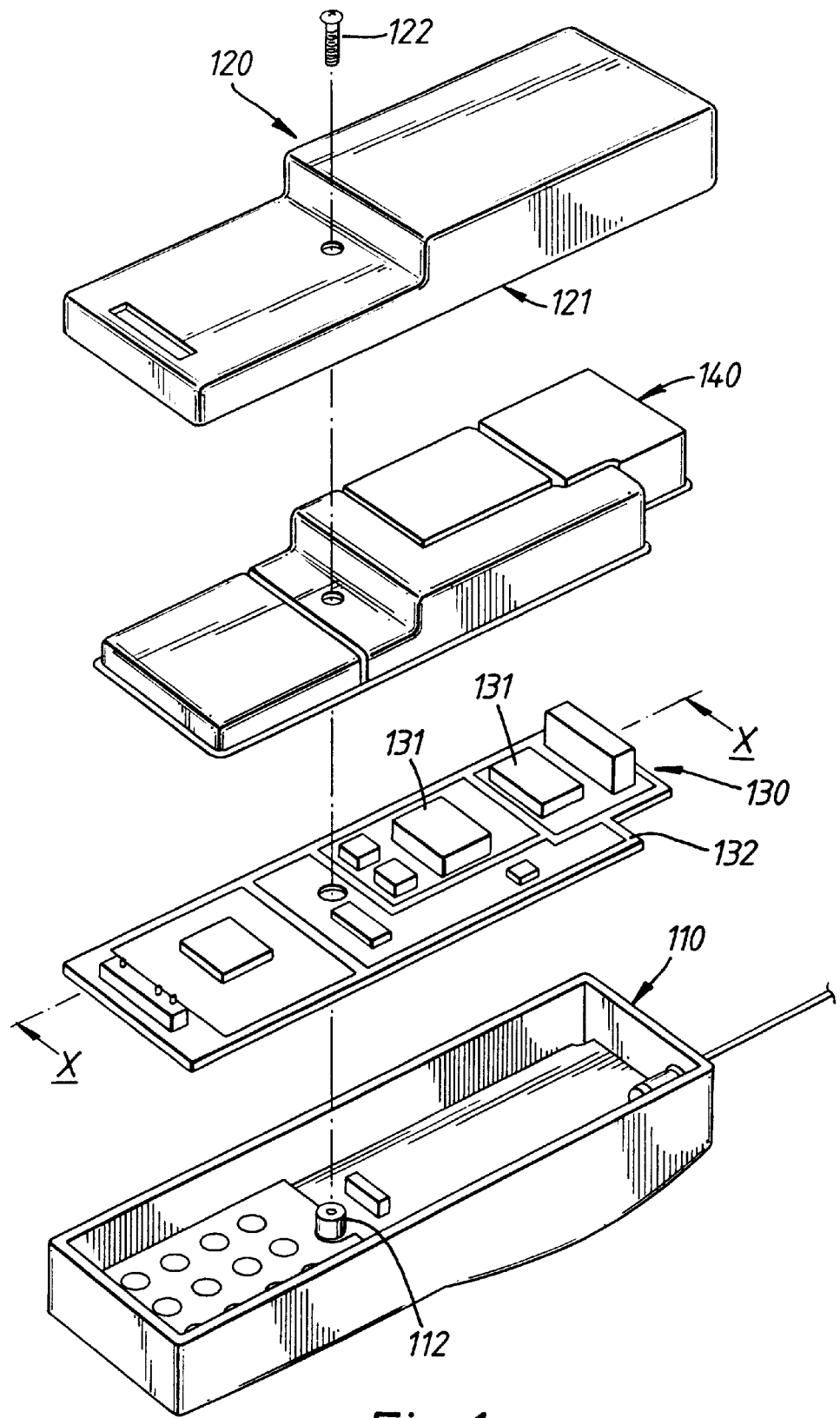
FIG. 1 is a perspective view illustrating a radio telecommunication apparatus according to a first embodiment of the present invention.

FIG.1 shows a radio telecommunication apparatus (referred to hereinafter as an apparatus) including a shield structure of the present invention.

The apparatus includes a first housing 110, a second housing 120 with a space 121, a PC board 130 and a shield case 140 mating with the space 121 for shielding components 131 mounted on the PC board 130. A ground pattern 132 is printed on the PC board 130. The first housing 110 is fitted to the second housing 120 by a male screw 122 and female screw 112 mating with the male screw 122. This structure is illustrated in FIG. 2 in detail which is a cross-sectional view taken along line x—x.

Figure 2:
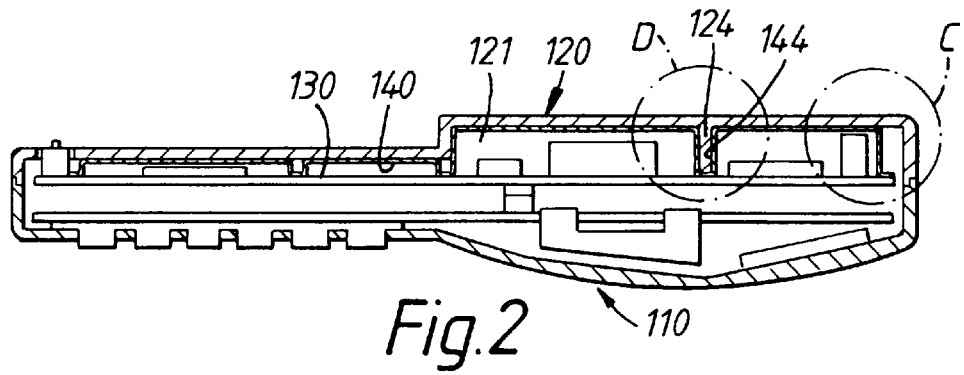
FIG. 2 is a cross-sectional view taken along line X—X of FIG. 1.

Referring to FIG. 2, the second housing 120 has a protruding portion 124 as a first location determination portion. The shield case 140 includes a groove portion 144 mating with the protruding portion 12. The groove portion 144 serves as a second location determination portion. Since the groove portion mates with the protruding portion, the shield case 140 is located at a predetermined area of the second housing 120.

Figure 3:
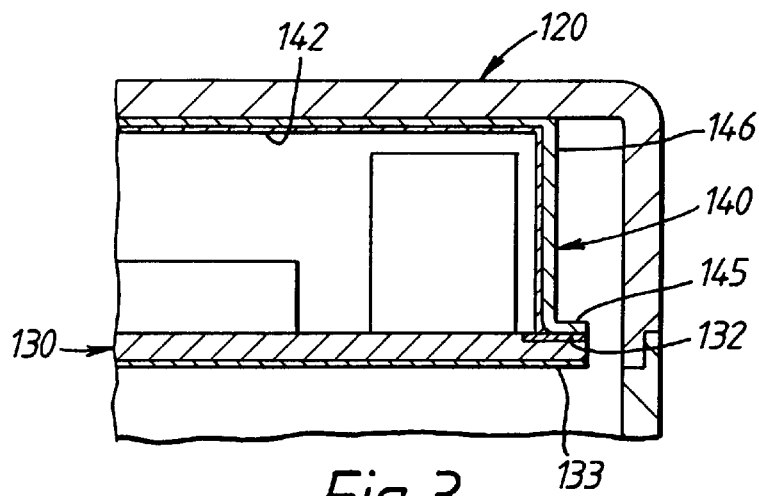
FIG. 3 is a partial cross-sectional view illustrating a portion C of FIG. 2.
Figure 4:
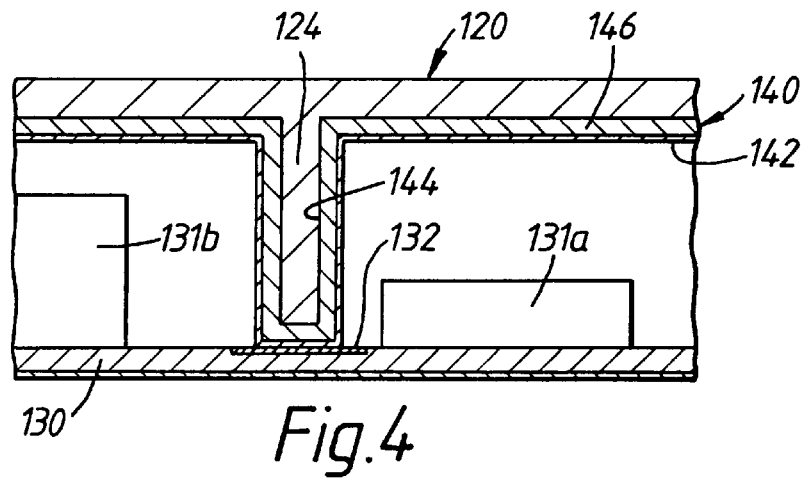
FIG. 4 is a partial cross-sectional view illustrating a portion D of FIG. 2.

A first partial structure illustrated by one dot line C is shown in FIG. 3, while a second partial structure illustrated by one dot line D is shown in FIG. 4. Referring to FIG. 3, the shield case 140 includes a resin member 146 and a conductive layer 142 plated on an inner surface of the resin member 146. When the shield case 140 is clamped between the circuit board 130 and the second housing 120 by the male and female screws as shown in FIG. 1, the shield case 140 is urged toward the PC board 130. Therefore, the conductive layer 142 contacts the first ground pattern 132.

Referring to FIG. 4, the groove portion 144 mates with the protruding portion 124. Thereby the shield case 140 is located at a predetermined area of the second housing 120. Further, the conductive layer 142 on the groove portion 144 contacts the first ground pattern 132. Therefore, the groove portion 144 serves as a wall for isolating a component 131a and a component 131b, and for dividing the space enclosed by the shield case 140 and the PC board 130, into a plurality of spaces.

The shield case 140 is made by following process illustrated by FIGS. 5 and 6. In a first step illustrated by FIG. 5, a resin member 146 is formed by a resin molding method so that the resin member 146 mates with the protruding portion 124 and the space 121 of the second housing 120. In a second step, the conductive layer 142 is plated in the inner surface of the resin member 146, a flange portion 145 of the shield case 140 and the other surface 147 of the groove portion 144.

The resin member 146 has 0.15 mm–0.25 mm thickness and approximately 0.6 g weight. The housing has 1 mm–2.5 mm thickness and approximately 1.5 g weight. Therefore, the resin member 146 is much thinner than the second housing 120 and much lighter than the second housing 120.

The molding process is well known, such as a vacuum forming, plug assist forming, injection molding with vacuum which assists fluid resin flow in a mold.

The resin member 146 may be made of polyester resin, (called PET hereinafter), polycarbonate(called PC hereinafter), polyvinyl chloride(called PVC hereinafter) or ABS(acrylonitrile butadiene styrene). We evaluated properties of each material. The result of the evaluation is shown in FIG. 7. As a result of the evaluation, PC and ABS are suitable for the resin member 146 in light of heat suitability and age softening. Since PC is used for food case and less expensive than ABS, PC is preferable to ABS.

The conductive layer 142 is plated on the inner surface of the resin member 146. However, the conductive layer 142 may be provided on the resin member 146 by other following method well known in the art. There are some methods such as painting, sputtering, ion plating, evaporated metal attaching method which attaches evaporated metal to a resin object in vacuum air.

The conductive layer 142 includes Ni(Nickel), Cu(Copper). The conductive layer 142 may include Au(Gold), Ag(Silver). Further, the conductive layer 142 has 1 μm–3 μm thickness.

Figure 8:
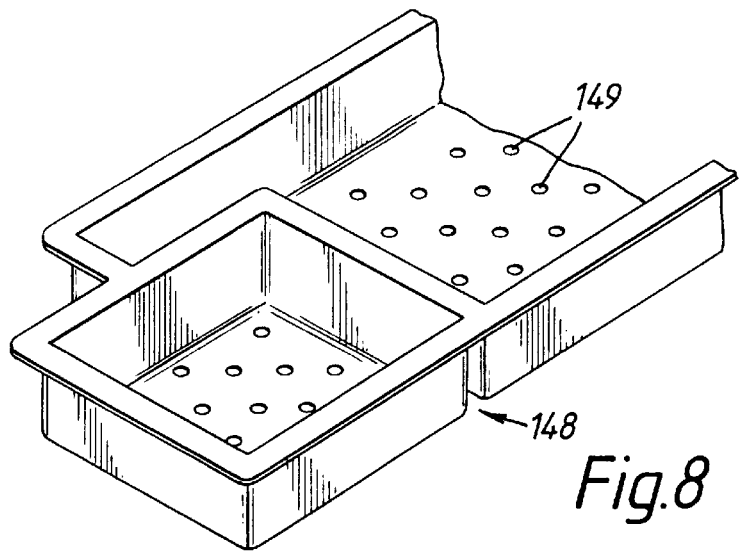
FIG. 8 is a perspective view illustrating a shield case according to a second embodiment.
Figure 9:
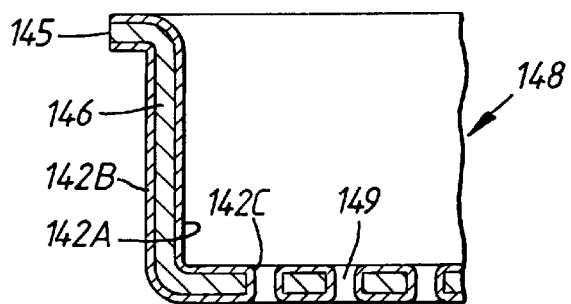
FIG. 9 is a partial cross-sectional view illustrating aspects relating to the second embodiment illustrated in FIG. 8.

Although the conductive layer 142 is provided on the inner surface of the resin member 146, the conductive layer may be provided on the outer surface of the resin member 146 as shown in FIGS. 8 and 9. A shield case 148 includes holes 149. A conductive layer 142C is also provided on an inner surface of the holes 149. Thereby, the conductive layer 142B on the outer surface is connected with the conductive layer 142A on the inner surface via the conductive layer 142C on the holes 149. The holes have a wavelength/50 pitch, where the apparatus communicates signals with a base station over a radio channel having the wavelength. In this state, electromagnetic signals are not inserted into the shield case 148 via the holes 149, and the components in the shield case 148 does not radiate electromagnetic signals outside.

In this arrangement, a shield efficiency by the shield case 148 of this structure is about the same as the conventional structure with the conductive shield case having the same thickness as that of the shield case 148.

As mentioned above, the shield case 140 mates with the space 121 of the second housing 120 and the protruding portion 124 and is clamped by the PC board 130 and the second housing 120 when the first housing 110 is fitted to the second housing 120 by the male and female screws 112 and 122. Therefore, deadspace between the second housing 120 and the shield case 140 is eliminated.

Further, it is unnecessary to plate a conductive layer on the housing.

Furthermore, when the male screw 122 is removed from the female screw 112, the shield case 140 is separated from the housing 120. Therefore, it is easy to dispose the second housing 120 without the conductive layer. Therefore, this structure is suitable for disposal and recycle of resin material.

Since the shield case is urged toward the PC board by the male and female screws and has very thin thickness, the flange portion 145 and the other surface 147 of the groove portion 144 have large elasticity. Therefore, it is unnecessary to solder the shield case to the PC board like the conventional structure. Further, the shield case 140 is firmly connected with the first ground pattern 132 by the large elasticity of the flange portion 145 and the other surface 147 of the groove portion 144.

Figure 10:
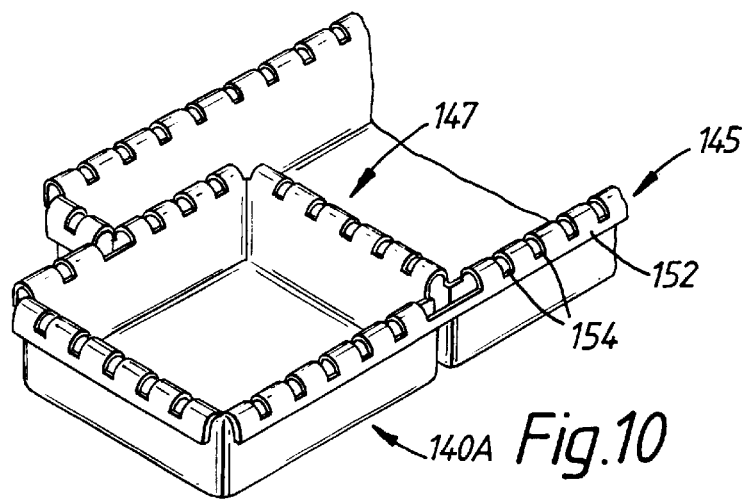
FIG. 10 is a perspective view illustrating a shield case according to a third embodiment.

The flange portion 145 and the other surface 147 of the groove portion 144 may have other structures as shown in FIG. 10. The flange portion 145 and the other surface 147 of the groove portion 144 have tongues 152 and grooves 154. When the first housing is fitted to the second housing, the tongue 152, as shown in FIG. 11(a), is urged toward the PC board 130, thereby is deformed as shown in FIG. 11(b). This structure enhances the connection between the shield case 140A and the ground pattern 132 on the PC board 130. When the first housing is removed from the second housing, the shape of the tongue 152 becomes the initial shape as shown in FIG. 11(a) by elasticity of the tongue 152.

Further, the flange portion 145 and the other surface 147 of the groove portion 144 may have hemispheres as shown in FIG. 12. A shield case 140B has a plurality of hemispheres 156 on the flange portion 145 and the other surface 147 of the groove portion 144. Each of the hemispheres 156 is arranged with a predetermined separation distance and has elasticity. When the first housing is fitted to the second housing, hemisphere 156 as shown in FIG. 13(a) is urged toward the PC board 130, thereby is deformed as shown in FIG. 13(b). This structure enhances the connection between the shield case 140B and the ground pattern 132 on the PC board 130. When the first housing is removed from the second housing, the shape of the hemisphere 156 becomes the initial shape as shown in FIG. 13(a) by elasticity of the hemisphere 156.

Figure 14:
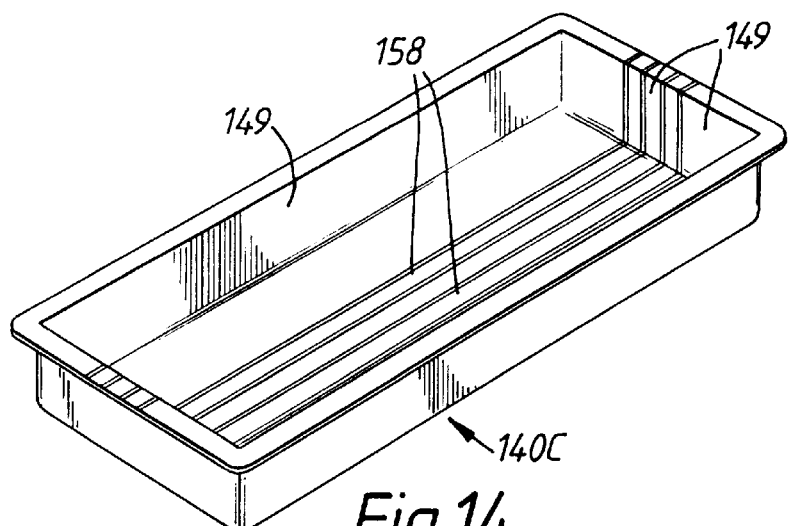
FIG. 14 is a perspective view illustrating a shield case according to a fifth embodiment.
Figure 15:
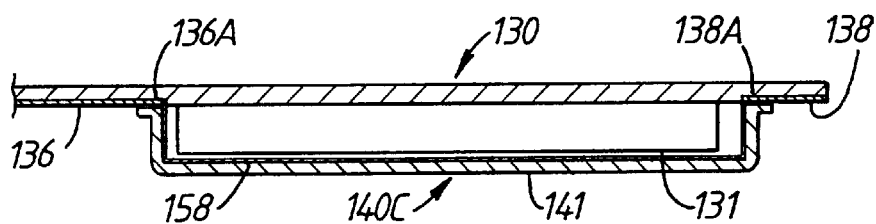
FIG. 15 is a partial cross-sectional view illustrating the attachment state of the shield case according to the fifth embodiment.

Although only the conductive layer for shielding the components is provided on the shield case in the above embodiment, another conductive material separated from the conductive layer may be provided on the shield case. Referring to FIGS. 14 and 15, a shield case 140C has a first conductive layer 149 for shielding the components and a second conductive layer 158 for connecting a first signal pattern 136 with a second signal pattern 138. The second conductive layer 158 is connected with a first land 136A coupled to the first signal pattern 136 and a second land 138A coupled to the second signal pattern 138.

In this arrangement, the shield case 140C shields the components 131 and also connects the first signal pattern 136 and the second signal pattern 138.

Figure 16:
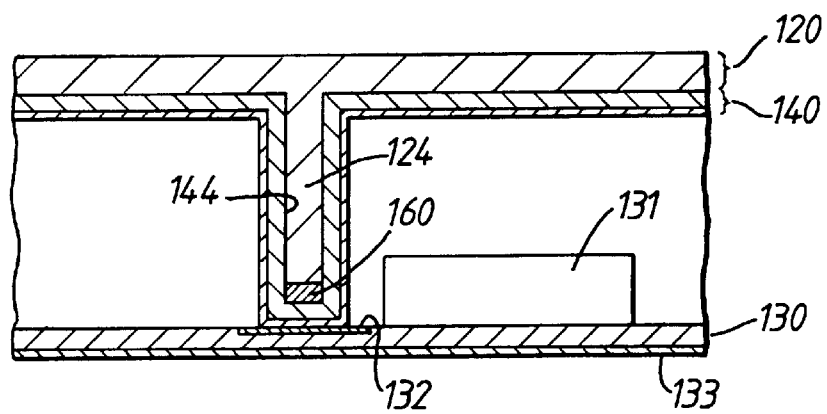
FIG. 16 is a partial cross-sectional view illustrating shield case according to a sixth embodiment.

Further, to enhance the connection between the conductive layer 142 and the first ground pattern 132, as shown in FIG. 16, an elastic member 160 such as sponge may be arranged between the protruding portion 124 of the second housing 120 and the groove portion 144 of the shield case 140.

Figure 17A:
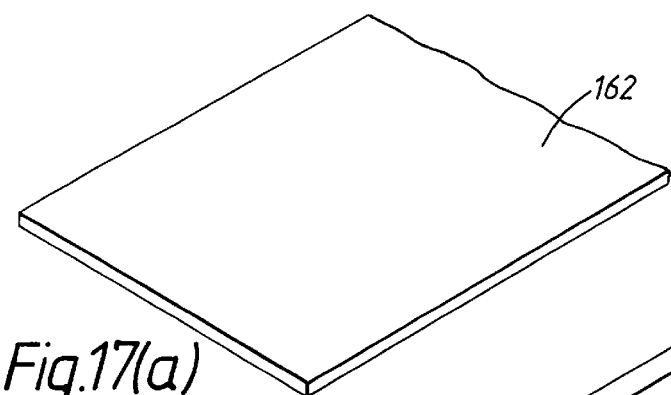
FIGS. 17(a) and 17(b) perspective view illustrating a manufacturing process in which a shield case according to a seventh embodiment is manufactured.
Figure 17B:
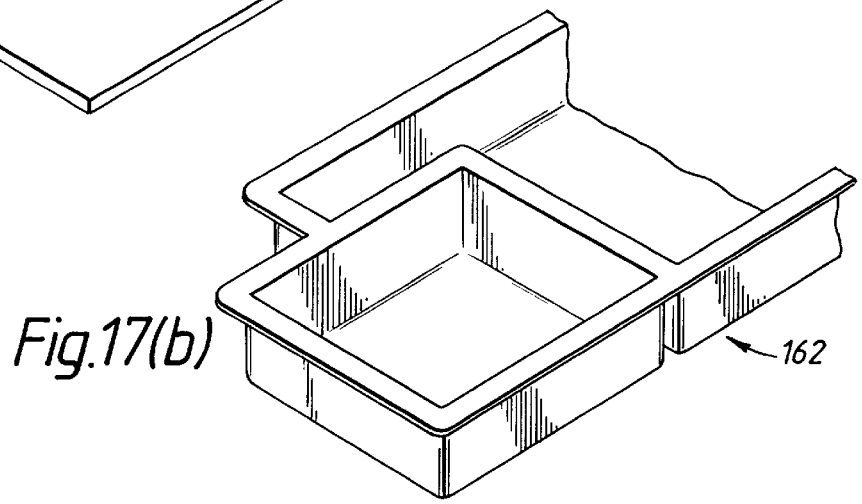

Furthermore, as shown in FIG. 5, in the above embodiments, the resin is deformed by resin mold injection method so that the deformed resin member 146 mates with the second housing. After that, the conductive layer 142 is provided on the resin member 146. However, a metal plate may be deformed as shown in FIG. 17. A metal plate 162 as shown in FIG. 17(a) such as copper plated with Nickel is deformed by well known method such as plastic deformation so that the deformed metal plate 162 mates with the second housing as shown in FIG. 17(b). The metal plate 162 is 0.1 mm in thickness.

Although the metal plate is deformed in the above embodiment, the resin plate plated with a conductive layer such as Nickel and Copper may be deformed by the plastic deformation.

Figure 18A:
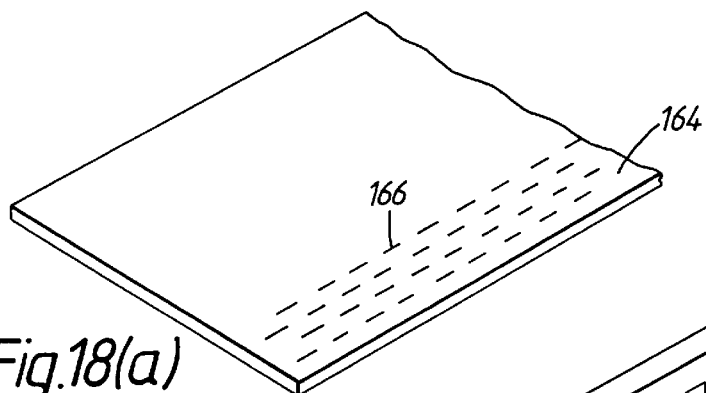
FIGS. 18(a) and 18(b) perspective view illustrating a manufacturing process in which a shield case according to an eighth embodiment is manufactured.
Figure 18B:
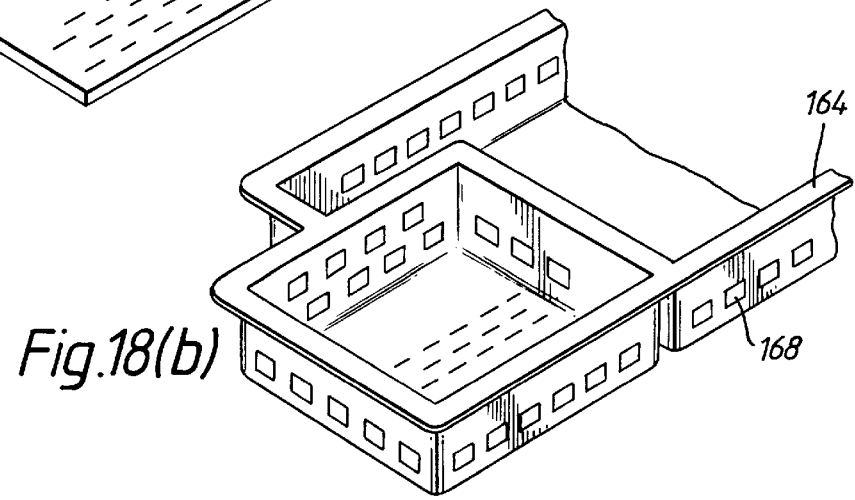
Figure 19:
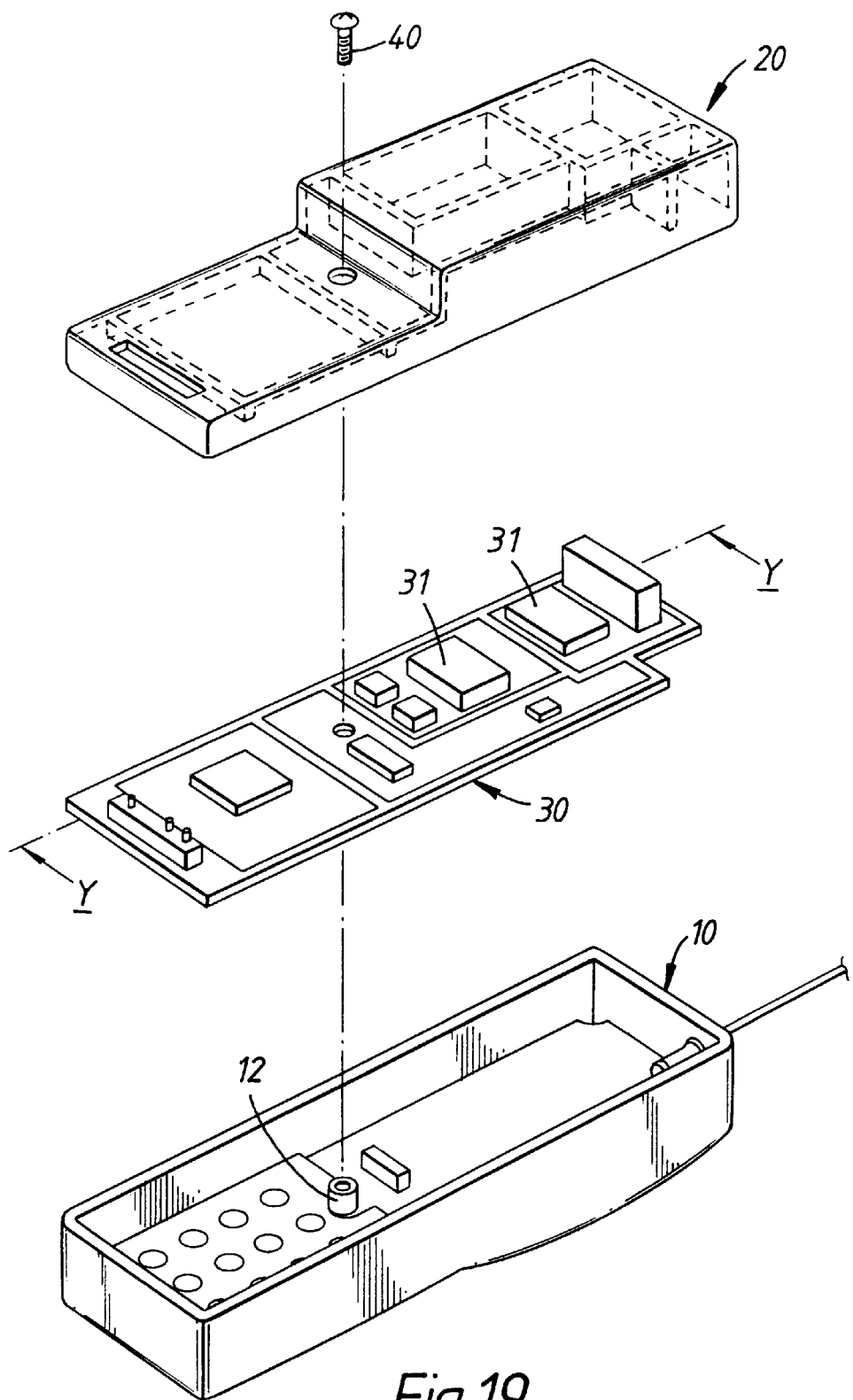
FIG. 19 is a perspective view illustrating a first conventional radio telecommunication apparatus including a first conventional shield structure.
Figure 20:
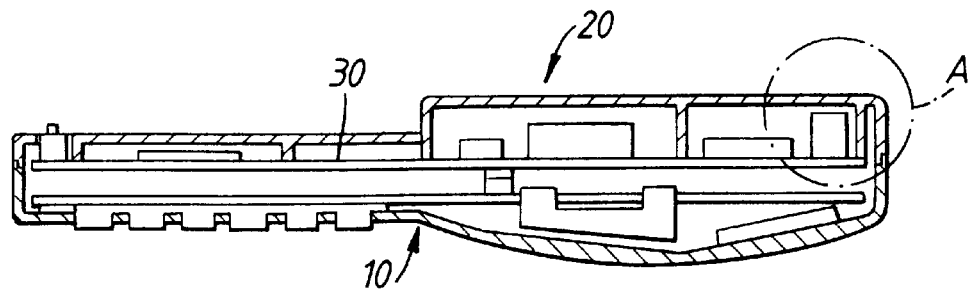
FIG. 20 is a cross-sectional view taken along line Y—Y of FIG. 19.
Figure 21:
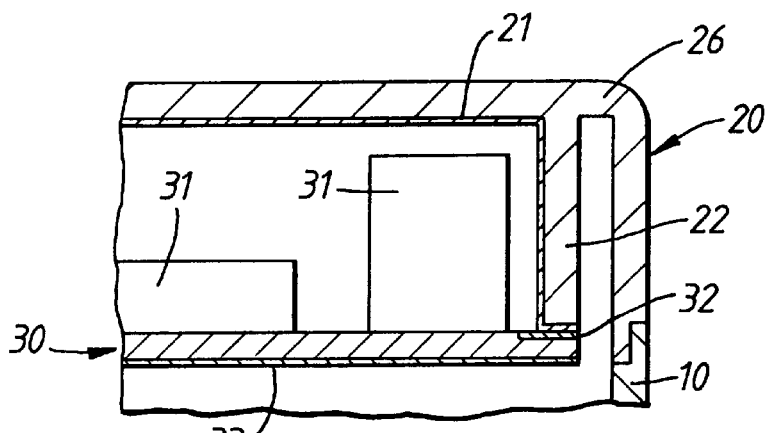
FIG. 21 is a partial cross-sectional view illustrating a portion A of FIG. 20.
Figure 22:
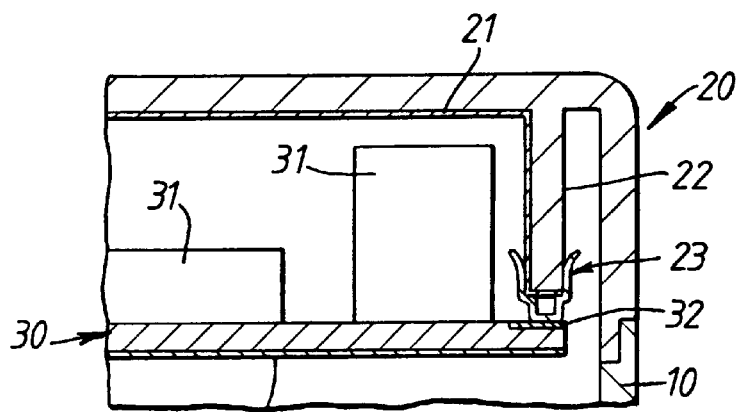
FIG. 22 is a partial cross-sectional view illustrating a second conventional apparatus including a second conventional structure.
Figure 23:
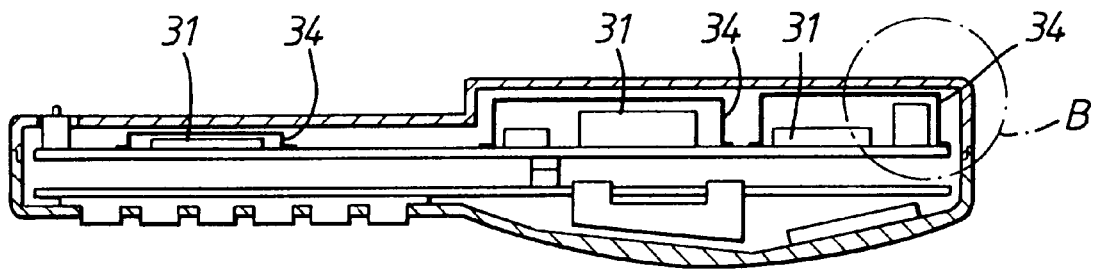
FIG. 23 is a cross-sectional view illustrating a third conventional apparatus including a third conventional structure.
Figure 24:
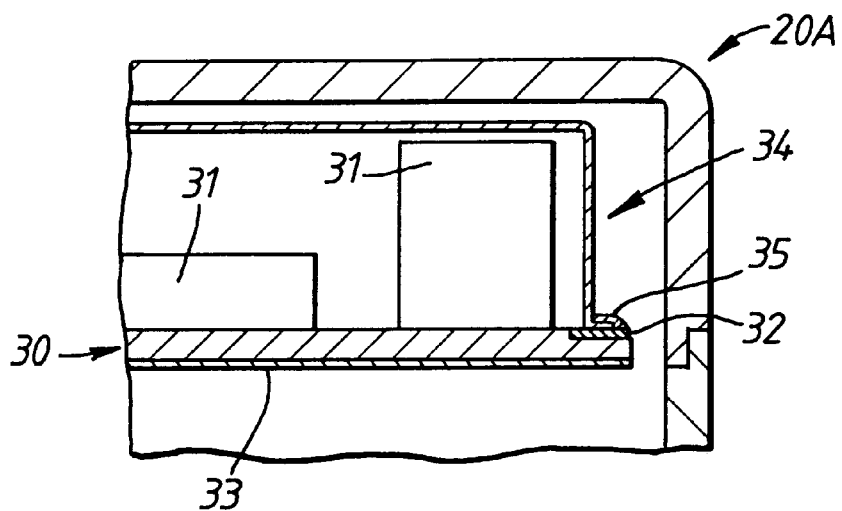
FIG. 24 is a partial cross-sectional view illustrating a portion B of FIG. 23.

Further, to facilitate the plastic deformation of the plate, a plurality of slits 166 may be provided at the plate as shown in FIG. 18. A metal plate 164 has a plurality of slits 166 as shown in FIG. 18(a). After the plastic deformation of the plate 164, the slits 166 becomes holes 168 FIG. 18(b). Therefore, the structure facilitates the plastic deformation.

In this arrangement, each hole 168 has a pitch of an wavelength/50, where the apparatus communicates with a base station over a radio channel having the wavelength. Therefore, electromagnetic signals are not inserted into the shield case via the holes, and the components in the shield case does not radiate electromagnetic signals outside.

Further, although these embodiments of the present invention are used in a radio telecommunication apparatus, these embodiments may be used in other electronic apparatus having components to be shielded.

Furthermore, referring to FIG. 4, although the protruding portion 124 serves as the first location determination portion and the groove portion 144 serves as the second location determination portion, a groove portion may be provided at the second housing and may serve as the first location determination portion, and a protruding portion may be provided at the shield case and may serve as the second location portion.

Further, referring to FIGS. 10 and 12, although the flange portion 145 and the other surface 147 of the groove portion 144 are provided with tongues 152 and hemispheres 156, the flange portion 145 and the other surface 147 of the groove portion 144 may be deformed in advance so that they have portion curved toward the PC board so that the curved portion has elasticity.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable on skilled in the art to utilize the invention in various embodiments and with various modifications as are suited to the particular use contemplated. It is intended that the scope of the invention be defined by the claims, appended hereto and their equivalents.

What is claimed is:

1. An electronic apparatus comprising:

a circuit board having a ground pattern;

components mounted on the circuit board;

a housing including a first location determination portion;

a shield case for shielding the components, including a molded resin member having a second location determination portion mating with the first location determination portion and including a conductive layer provided on the shield case; and wherein the shield case is clamped between the circuit board and the housing with the second location determination portion pressed against the circuit board, and with the conductive layer on the second location determination portion contacting the ground pattern.

2. The electronic apparatus of claim 1, wherein the conductive layer is provided on an inner surface of the resin member.

3. The electronic apparatus of claim 2, wherein the resin member is made of polycarbonate.

4. The electronic apparatus of claim 1, wherein the shield case further comprises a wall for dividing a space enclosed by the shield case and the circuit board, into a plurality of spaces.

5. The electronic apparatus of claim 4, wherein the wall is the second location determination portion.

6. The electronic apparatus of claim 1, wherein the shield case has a contact portion contacting the ground pattern.

7. The electronic apparatus of claim 6, wherein the contact portion has an elasticity to enhance the contact between the shield case and the ground pattern.

8. The electronic apparatus of claim 1, wherein the shield case includes a connection line for electrically connecting a first signal line on the circuit board with a second signal line on the circuit board, the connection line being provided on the shield case and separated from the conductive layer.

9. The electronic apparatus of claim 1, further comprising an elastic member provided between the first location determination portion and the shield case.

10. The electronic apparatus of claim 1, wherein the conductive layer at the second location determination portion contacts the ground pattern, whereby the second location determination portion enhances the contact between the shield case and the ground pattern.

11. A shield case for use in an electronic apparatus enclosed in a housing, the housing having a first location determination portion, the shield case adapted for attachment to a circuit board having a ground pattern, the shield case comprising:

a molded resin member having a second location determination portion adapted to mate with the first location determination portion;

a conductive layer provided on the shield case; and wherein the shield case is adapted to be clamped between the circuit board and the housing with the second location determination portion pressed against the circuit board, and with the conductive layer on the second location determination portion contacting the ground pattern.

12. The shield case of claim 11, wherein the conductive layer is provided on an inner surface of the resin member.

13. The shield case of claim 12, wherein the resin member is made of polycarbonate.

14. The shield case of claim 11, further comprising a wall for dividing a space enclosed by the shield case and the circuit board, into a plurality of spaces.

15. The shield case of claim 14, wherein the wall is the second location determination portion.

16. The shield case of claim 11, further comprising a contact portion contacting the ground pattern.

17. The shield case of claim 16, wherein the contact portion has an elasticity to enhance the contact between the shield case and the ground pattern.

18. The shield case of claim 11, further comprising a connection line for electrically connecting a first signal line on the circuit board with a second signal line on the circuit board, the connection line provided on the shield case and separated from the conductive layer.

19. The shield case of claim 11, further comprising an elastic member provided between the first location determination portion and the shield case.

20. An electronic apparatus comprising:

a circuit board having a ground pattern;

components mounted on the circuit board;

a housing including a protruding portion;

a shield case for shielding the components, including a molded resin member having a grooved portion mating with the protruding portion and including a conductive layer provided on the shield case; and wherein the shield case is clamped between the circuit board and the housing with the grooved portion pressed against the circuit board, and with the conductive layer on the grooved portion contacting the ground pattern.

21. The electronic apparatus of claim 20, wherein the groove portion is a wall for dividing a space enclosed by the shield case and the circuit board, into a plurality of spaces.

22. A shield case for use in an electronic apparatus enclosed in a housing, the housing having a protruding portion, the shield case adapted for attachment to a circuit board having a ground pattern, the shield case comprising:

a molded resin member having a grooved portion adapted to mate with the protruding portion; and a conductive layer provided on the shield case;

wherein the shield case is adapted to be clamped between the circuit board and the housing with the grooved portion pressed against the circuit board, and with the conductive layer on the grooved portion contacting the ground pattern.

23. The shield case of claim 22, wherein the groove portion is a wall for dividing a space enclosed by the shield case and the circuit board, into a plurality of spaces.

* * * * *